(12) United States Patent
Char et al.

(10) Patent No.: US 12,342,566 B2
(45) Date of Patent: Jun. 24, 2025

(54) TWO-DIMENSIONAL ELECTRON GAS AT INTERFACE BETWEEN BASNO$_3$ AND LAINO$_3$

(71) Applicant: SEOUL NATIONAL UNIVERSITY R&DB FOUNDATION, Seoul (KR)

(72) Inventors: Kook Rin Char, Seoul (KR); Young Mo Kim, Seoul (KR); You Jung Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 650 days.

(21) Appl. No.: 17/775,868

(22) PCT Filed: Sep. 11, 2019

(86) PCT No.: PCT/KR2019/011863
§ 371 (c)(1),
(2) Date: Oct. 27, 2022

(87) PCT Pub. No.: WO2021/049686
PCT Pub. Date: Mar. 18, 2021

(65) Prior Publication Data
US 2023/0045518 A1 Feb. 9, 2023

(51) Int. Cl.
*H10D 30/47* (2025.01)
*H01L 21/02* (2006.01)

(52) U.S. Cl.
CPC ..... *H10D 30/475* (2025.01); *H01L 21/02192* (2013.01); *H01L 21/02194* (2013.01)

(58) Field of Classification Search
CPC ........... H01L 29/7786; H01L 21/02192; H01L 21/02194; H01L 21/0242; H01L 21/02483;
(Continued)

(56) References Cited

FOREIGN PATENT DOCUMENTS

KR 10-2011-0093113 8/2011
KR 10-2014-0076111 A 6/2014
(Continued)

OTHER PUBLICATIONS

Junichi Shiogai, Kazuki Nishihara, Kazuhisa Sato, Atsushi Tsukazaki; Improvement of electron mobility in La:BaSnO3 thin films by insertion of an atomically flat insulating (Sr,Ba)SnO3 buffer layer. AIP Advances Jun. 1, 2016; 6 (6): 065305. https://doi.org/10.1063/1.4953808 (Year: 2016).*

(Continued)

*Primary Examiner* — Matthew C Landau
*Assistant Examiner* — Ethan Edward Cutler
(74) *Attorney, Agent, or Firm* — Kilpatrick Townsend & Stockton LLP (57) ABSTRACT

Provided is an electronic device using an interface between BaSnO$_3$ and LaInO$_3$, the electronic device including: a substrate formed of a metal oxide of non-SrTiO$_3$ material a first buffer layer disposed on the substrate and formed of a BaSnO$_3$ material; a BLSO layer disposed on at least a portion of the first buffer layer and formed of a (Ba$_{1-x}$, La$_x$)SnO$_3$ material, wherein x has a value equal to or greater than 0 and less than or equal to 1; an LIO layer at least partially disposed on at least a portion of the BLSO layer so as to form an interface between the LIO layer and the BLSO layer, and formed of an LaInO$_3$ material; and a first electrode layer at least partially in contact with the interface between the BLSO layer and the LIO layer, and formed of at least two or more separated portions.

6 Claims, 10 Drawing Sheets

(58) Field of Classification Search
CPC ......... H01L 21/02488; H01L 21/02502; H01L 21/02565; H01L 21/28; H01L 21/285; H01L 29/0657; H01L 29/24; H01L 29/42316; H01L 29/778
See application file for complete search history.

(56) References Cited

FOREIGN PATENT DOCUMENTS

| | | | | |
|---|---|---|---|---|
| KR | 10-2016-0115076 A | 6/2016 | | |
| KR | 101610895 B1 | 8/2016 | | |
| WO | WO-2016153172 A1 * | 9/2016 | ....... | H01L 29/78606 |
| WO | 2018-231909 A | 12/2018 | | |

OTHER PUBLICATIONS

Young Mo Kim, Chulkwon Park, Taewoo Ha, Useong Kim, Namwook Kim, Juyeon Shin, Youjung Kim, Jaejun Yu, Jae Hoon Kim, Kookrin Char; High-k perovskite gate oxide BaHfO3. APL Mater. Jan. 1, 2017; 5 (1): 016104. https://doi.org/10.1063/1.4974864 (Year: 2017).*

WO 2016153172 A1 Description Translation (Year: 2016).*

International Application No. PCT/KR2019/011863 received an International Preliminary report on Patentabilty mailed Mar. 15, 2022, 5 pages.

International Application No. PCT/KR2019/011863 received an International Search Report and Written mailed Jun. 12, 2020, 9 pages original document, English Translation and Original Document attached.

Useoong Kim, Chulkwon Park, Taewoo Ha, Young Mo Kim, Namwook Kim, Chanjong Ju, Jisung Park, Jaejun Yu, Jae Hoon Kim, and Kookrin Char, 'All-perovskite transparent high mobility field effect using epitaxial $BaSnO_3$ and $LaInO_3$', APL Mater. 3, 036101, Feb. 25, 2015, 8 pages, online at: https://doi.org/10.1063/1.4913687.

Useong Kim, Chulkwon Park, Young Mo Kim, Juyeon Shin, and Kookrin Char, 'Conducting interface states at $LaInO_3/BaSnO_3$ polar interface controlled by Fermi level', APL Mater. 4, 071102 Jul. 27, 2016,8 pages, online at http://dx.doi.org/10.1063/1.4959960.

Youjung Kim, Young Mo Kim, Juyeon Shin and Kookrin Char, "$LaInO_3$/BaSnO polar interface on MgO substrates", APL Materials 6, 096104, Sep. 12, 2018, 8 pages, online at: https://doi.org/10.1063/1.5046368.

Youjung Kim, Young Mo Kim, Juyeon Shin and Kookrin Char, "$LaInO_3/BaSnO_3$ polar interface on MgO substrates" iWOE25, $25^{th}$ International Workshop on Oxide Electronics, B74, Oct. 3, 2018, 19 pages.

Young Mo Kim, Youjung Kim, Juyeon Shin, Kookrin Char, "2DEG state at $LaInO_3 / BaSnO_3$ interface", APS March Meeting 2019, vol. 64, No. 2, Session E45, Mar. 5, 2019, 30 pages.

* cited by examiner

TWO-DIMENSIONAL ELECTRON GAS AT INTERFACE BETWEEN BASNO₃ AND LAINO₃

TECHNICAL FIELD

The present disclosure relates to an oxide semiconductor, and more particularly, to an electronic device using an interface between $BaSnO_3$ and $LaInO_3$.

BACKGROUND ART

A metal oxide semiconductor is a semiconductor formed of a metal oxide, and as the metal oxide semiconductor has been successfully commercialized as an organic light-emitting diode (OLED) device or the like and a possibility of application thereof as other electronic devices, such as a power transistor, has been on the rise, the metal oxide semiconductor is largely receiving attraction as a next-generation semiconductor material after silicon (Si).

One of most recent topics of conversation is that a unique property appears at an interface of an oxide semiconductor heterojunction, and superconductive or ferromagnetic property has been discovered at an oxide semiconductor interface of a perovskite structure, such as $LaAlO_3/SrTiO_3$ or the like, and high electron mobility as well as a quantum Hall effect have been discovered at an oxide semiconductor interface of a wurtzite structure, such as AlGaN/GaN, MgZnO/ZnO, or the like. Electron reconstruction and oxygen vacancy have been presented as causes for formation of a so-called 2-dimensional electron gas (2DEG).

Researchers of the present application have discovered that $BaSnO_3$ that is a perovskite oxide has high mobility, and realized various complex structures by using $BaSnO_3$ and proposed a possibility of application thereof on an electronic device.

PRIOR ART DOCUMENTS (Non-Patent Document 1) Useoong Kim, Chulkwon Park, Taewoo Ha, Young Mo Kim, Namwook Kim, Chanjong Ju, Jisung Park, Jaejun Yu, Jae Hoon Kim, and Kookrin Char, 'All-perovskite transparent high mobility field effect using epitaxial $BaSnO_3$ and $LaInO_3$', APL Mater. 3, 036101 (2015)

(Non-Patent Document 2) Useoong Kim, Chulkwon Park, Young Mo Kim, Juyeon Shin, and Kookrin Char, 'Conducting interface states at $LaInO_3/BaSnO_3$ polar interface controlled by Fermi level', APL Mater. 4, 071102 (2016)

DESCRIPTION OF EMBODIMENTS

Technical Problem

The present disclosure is to providing a high-performance electronic device by using an interface between $BaSnO_3$ and $LaInO_3$.

Solution to Problem

According to one aspect of the present disclosure, an electronic device using an interface between $BaSnO_3$ and $LaInO_3$, includes: a substrate formed of a metal oxide of non-$SrTiO_3$ material; a first buffer layer disposed on the substrate and formed of a $BaSnO_3$ material; a BLSO layer disposed on at least a portion of the first buffer layer and formed of a $(Ba_{1-x}, La_x)SnO_3$ material, wherein x has a value equal to or greater than 0 and less than or equal to 1; an LIO layer at least partially disposed on at least a portion of the BLSO layer so as to form an interface between the LIO layer and the BLSO layer, and formed of an $LaInO_3$ material; and a first electrode layer at least partially in contact with the interface between the BLSO layer and the LIO layer, and formed of at least two or more separated portions.

Advantageous Effects of Disclosure

According to the present disclosure, a high-performance electronic device using an interface between $BaSnO_3$ and $LaInO_3$ is provided.

BRIEF DESCRIPTION OF DRAWINGS

Embodiments shown in the drawings are essentially descriptive and exemplary, and are not intended to limit the present disclosure. Detailed description of explanatory examples below may be understood when read with the following drawings.

(a) through (c) of FIG. 4 are scanning transmission electron microscope (STEM) images regarding a through-thickness section of a basic structure using 2-dimensional electron gas properties of an interface between $BaSnO_3$ and $LaInO_3$, according to an embodiment of the present disclosure, wherein (a) illustrates a substrate of an MgO material, a buffer layer of a BHO material, a buffer layer of a BSO material, and an LIO layer are stacked, (b) illustrates an interface between BHO and BSO thereamong, and (c) illustrates an interface between BSO and LIO.

(a) and (b) of FIG. 7 illustrate results of experimenting with current-electron properties of an electronic device using 2-dimensional electron gas properties of an interface between $BaSnO_3$ and $LaInO_3$, according to an embodiment of the present disclosure.

MODE OF DISCLOSURE

The present disclosure may have various modifications and various forms, and embodiments of the present disclosure will be described in detail herein. However, this is not intended to limit the present disclosure to particular modes of practice, and it will be understood that all changes, equivalents, and substitutes that do not depart from the spirit and technical scope of the present disclosure are encompassed in the present disclosure.

The terms are used only to distinguish one component from another. Also, the terms used in the present specification are only used to describe specific embodiments, and are not intended to limit the present disclosure. An expression used in the singular encompasses the expression in the plural, unless it has a clearly different meaning in the context.

In the present disclosure, it is to be understood that terms such as "including" or "having", "formed of", and the like, are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, terms used herein, including technical or scientific terms, may have the same meaning as commonly understood by one of ordinary skill in the art described in the present disclosure. Terms that are defined in commonly used dictionaries should be interpreted as having meanings consistent with those in the context of the related art, and should not be interpreted in ideal or excessively formal meanings unless clearly defined in the present application.

In the present specification and the drawings, SrTiO$_3$, BaSnO$_3$, (Ba$_{1-x}$, La$_x$)SnO$_3$, LaInO$_3$, and BaHfO$_3$ may be respectively abbreviated to STO, BSO, BLSO, LIO, and BHO, according to the practical notation of the related art. BSO and BLSO may be commonly referred to as B(L)SO.

In the following description and drawings, compositions, thicknesses, and doping concentrations of some layers are specified, but these are only examples. Modifications, such as changes in presence of a BHO layer, presence of a layer performing an auxiliary role, a specific material, arrangement, and thickness of each layer, and doping concentration of a material including lanthanum, commonly made in the art without departing from the scope of the present disclosure as understood by one of ordinary skill in the art through the present specification are possible, and such modifications belong to the scope of the present disclosure.

Hereinafter, embodiments of the present disclosure will be described in more detail with reference to the accompanying drawings.

Figure 1:
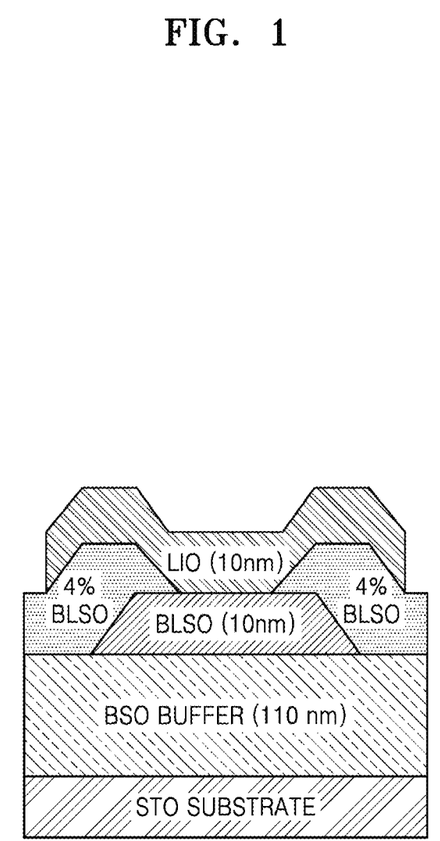
FIG. 1 illustrates an example of a basic structure using 2-dimensional electron gas properties of an interface between $BaSnO_3$ and $LaInO_3$, according to the prior art.

FIG. 1 illustrates an example of a basic structure using 2-dimensional electron gas properties of an interface between BaSnO$_3$ and LaInO$_3$, according to the prior art.

In FIG. 1, BSO is stacked with a thickness of 110 nm on an STO substrate at the bottom, BLSO is stacked with a thickness of 10 nm thereon, and 4% BLSO operating as an electrode is formed at both ends of the BLSO. LIO is stacked in a thickness of 10 nm on the BLSO and the 4% BLSO.

STO is selected as a substrate of the basic structure in the prior art because the STO has a same perovskite structure as the BSO and a similar lattice constant as the BSO. A BSO buffer operates as a buffer between the STO substrate and the BLSO, and a heterojunction of the BLSO and the LIO, which is an experiment target, is formed on the BSO buffer.

The 4% BLSO, i.e., a material (Ba$_{0.96}$La$_{0.04}$SnO$_3$) in which 4% lanthanum (La) is doped on Ba in BaSnO$_3$, is used as an electrode for the basic structure of the prior art of FIG. 1 and a basic structure of the present disclosure below. Because the electrode is deposited on the BSO, a material of the electrode needs to be similar to the BSO as much as possible. According to previous research results, when La is doped on the BSO, electric conductivity is improved, and electric conductivity improvement is almost saturated only with the doping of about 4%. Accordingly, the 4% BLSO is suitable to be used as the electrode. However, such a material of the electrode is only an example, and the electrode may be replaced by an electrode of a material having another useful property, and the present disclosure is not limited by a specific material of the electrode.

Also, because an interface between the BLSO and the LIO is a target for measuring electric conductivity, the electrode is formed to contact both ends of the BLSO, for example, while partially covering the BLSO. When the electrode partially covers the BLSO, portions of the BLSO and LIO, where a 2-dimensional electron gas is formed, form an interface as the BLSO and the LIO directly contact each other without the 4% BLSO, and other portions thereof are connected to the 4% BLSO as the electrode between the BLSO and the LIO, and thus the 4% BLSO operates as the electrode contacting the interface formed as above. In other words, at least a portion of the 4% BLSO operating as the electrode is disposed on a BSO layer, and another portion thereof partially covers a BLSO layer. The electrode includes at least two separated portions so as to inject a current into the interface between the BLSO and the LIO, and receive the current that passed through the interface.

A current or voltage is applied to the electrode by using a method well known in the art, for example, a 4-probe method, thereby removing a resistance component caused by an electrode contact and measure resistance (electric conductivity) only of the interface.

Figure 2:
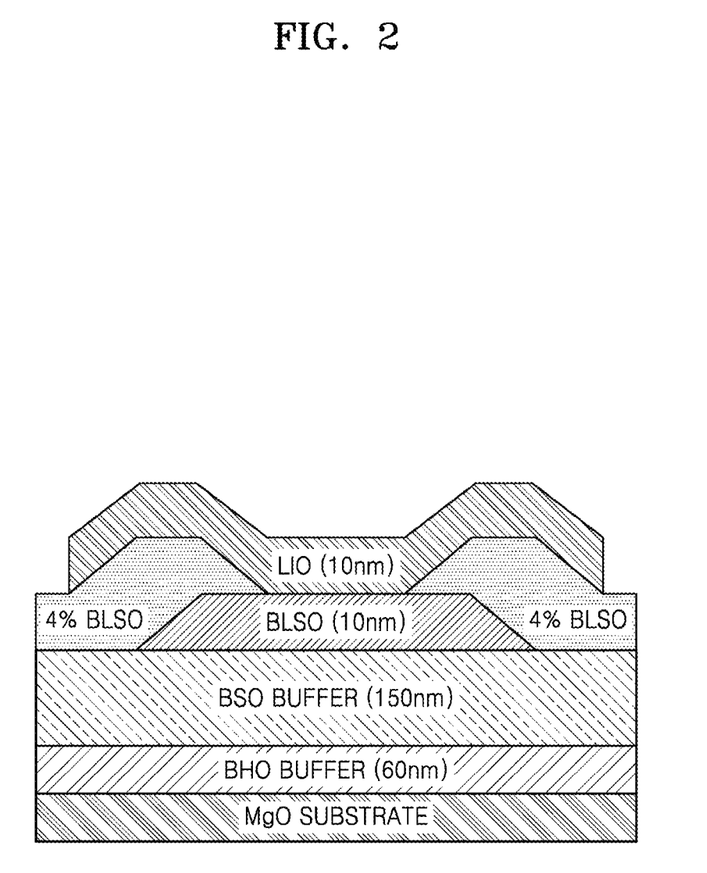
FIG. 2 illustrates a basic structure using 2-dimensional electron gas properties of an interface between $BaSnO_3$ and $LaInO_3$, according to an embodiment of the present disclosure.

FIG. 2 illustrates a basic structure using 2-dimensional electron gas properties of an interface between BaSnO$_3$ and LaInO$_3$, according to an embodiment of the present disclosure. In comparison with FIG. 1, the basic structure of FIG. 2 according to an embodiment of the present disclosure is different in that a material of a substrate is changed from STO to magnesium oxide (MgO) and a BHO buffer is additionally formed between the substrate and a BSO buffer.

The basic structure of FIG. 2 according to an embodiment of the present disclosure uses MgO for the substrate, instead of STO. Unlike STO that is a metal oxide of a perovskite structure, MgO is a metal oxide of a non-perovskite structure, and has a large bandgap and satisfactory oxygen stability. A lattice constant of BSO is 4.116 angstrom, and a lattice constant of STO used for a substrate in the prior art is 3.905 angstrom whereas a lattice constant of MgO is 4.212 angstrom, and thus it is determined that a lattice mismatch between MgO and BSO is much smaller than that between STO and BSO. However, MgO, i.e., the material of the substrate of the basic structure according to an embodiment of the present disclosure, is only an example, and the present disclosure may realize a substrate of a material other than various STOs.

Meanwhile, the MgO substrate is not directly connected to a BSO buffer layer, but is connected thereto through a BHO buffer layer, and BHO has a lattice constant of 4.189 angstrom, which is closer to the lattice constant of MgO than BSO. Accordingly, the BHO buffer layer buffers between MgO and BSO, thereby suppressing adverse effects generated due to a difference between lattice constants of MgO and BSO, for example, phenomena such as dislocation of atoms in a deposited BSO structure.

Figure 3:
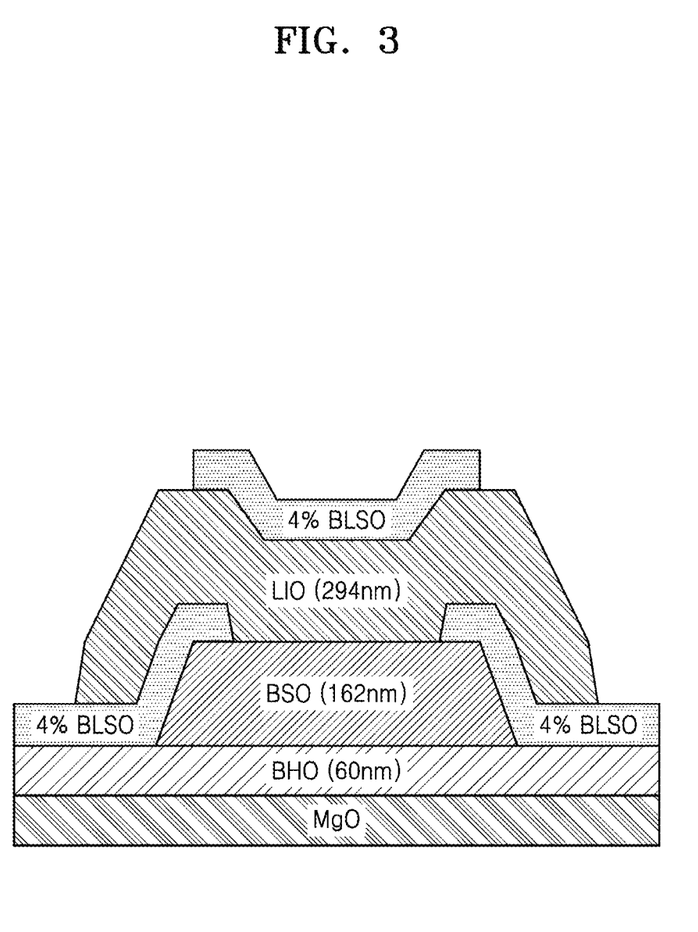
FIG. 3 illustrates a structure of an electronic device using 2-dimensional electron gas properties of an interface between $BaSnO_3$ and $LaInO_3$, according to an embodiment of the present disclosure.

FIG. 3 illustrates a structure of an electronic device using 2-dimensional electron gas properties of an interface between $BaSnO_3$ and $LaInO_3$, according to an embodiment of the present disclosure. FIG. 3 illustrates a structure of a field effect transistor (FET) as an example, but one of ordinary skill in the art may be able to easily develop other types of electronic devices by applying the basic structure of FIG. 2 using the 2-dimensional electron gas properties of the interface between $BaSnO_3$ and $LaInO_3$, according to an embodiment of the present disclosure, and such modifications are all within the scope of the present disclosure. For example, the basic structure of FIG. 2 may be used as a resistive element without addition of another structure, and as will be described in FIG. 3, another electronic device may be manufactured by adding another structure.

In comparison with FIG. 2, FIG. 3 is different in that 4% BLSO is further deposited on an LIO layer. In comparison with FIG. 2, thicknesses of BSO and LIO are different, but this is only a partial modification that is within the scope of the present disclosure. The FET includes three terminals, i.e., a source, a gate, and a drain, wherein in FIG. 3, left (or right) 4% BLSO functions as the source, right (or left) 4% BLSO functions as the drain, and 4% BLSO stacked on LIO functions as the gate. The 4% BLSO configuring the gate does not directly contact another electrode, i.e., the source and the drain. Meanwhile, an interface between BSO and LIO is formed between the source and the drain, and such an interface functions as a channel for transmitting electricity.

Hereinabove, the basic structure and electronic device using the 2-dimensional electron gas properties of the interface between $BaSnO_3$ and $LaInO_3$, according to an embodiment of the present disclosure, have been described. The corresponding structures may be manufactured by using a method well known in the art, as an unlimited example, pulsed laser deposition (PLD), and the present disclosure is not limited by a specific manufacturing method of the corresponding structure.

Figure 4:
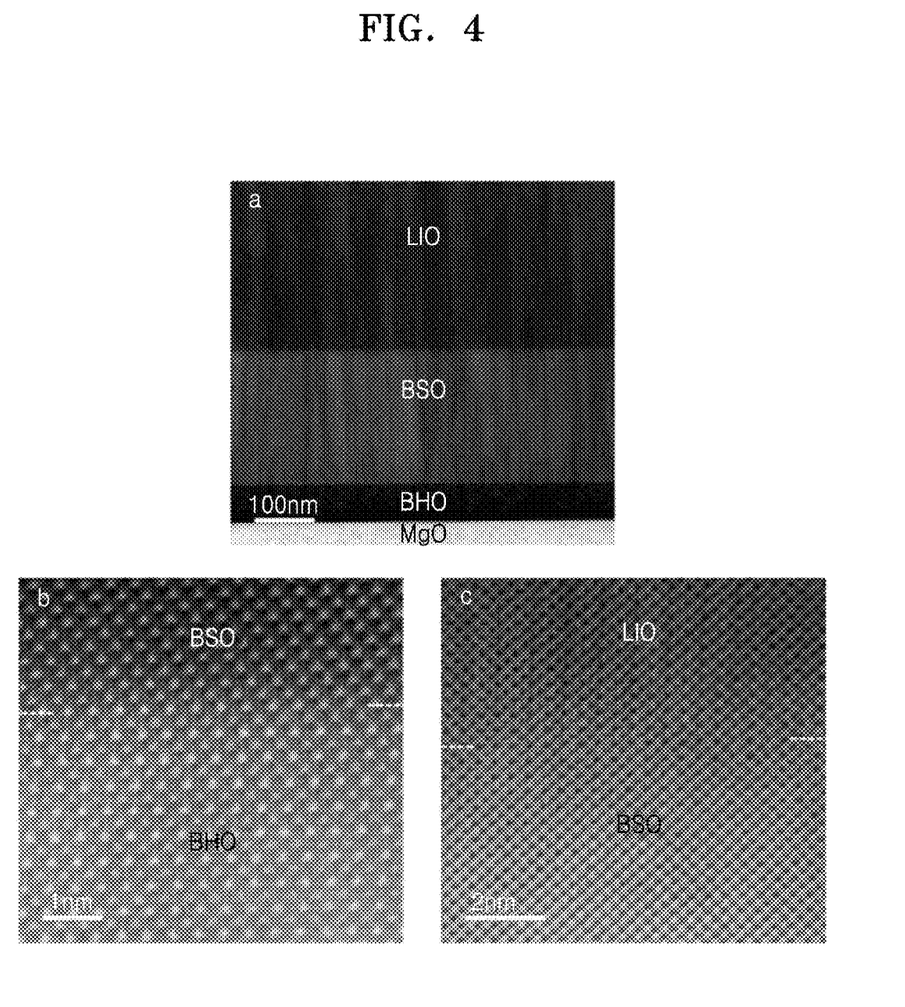

(a) through (c) of FIG. 4 are scanning transmission electron microscope (STEM) images regarding a through-thickness section of a basic structure using 2-dimensional electron gas properties of an interface between $BaSnO_3$ and $LaInO_3$, according to an embodiment of the present disclosure, wherein (a) illustrates a substrate of an MgO material, a buffer layer of a BHO material, a buffer layer of a BSO material, and an LIO layer are stacked, (b) illustrates an interface between BHO and BSO thereamong, and (c) illustrates an interface between BSO and LIO. It is determined that there is no dislocation or detachment due to heterojunction at each interface, and coherently epitaxial growth has been achieved. In particular, inventors of the present disclosure have identified that dislocation at the interface between BSO and LIO has been remarkably reduced in (c), owing to a BHO layer inserted between MgO and BSO.

Figure 5:
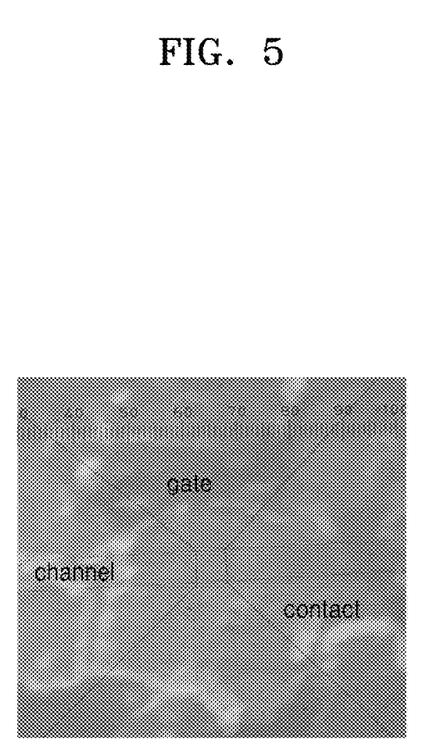
FIG. 5 is a plan view of an optical microscopic image of a field effect transistor manufactured in the structure of FIG. 3.

FIG. 5 is a plan view of an optical microscopic image of an FET manufactured in the structure of FIG. 3. Left and right contacts respectively correspond to a source and a drain of the FET consisting of 4% BLSO, and a structure extending from north to south corresponds to a gate of the FET consisting of 4% BLSO. A channel formed from east to west is formed by an interface between BSO and LIO.

Figure 6A:
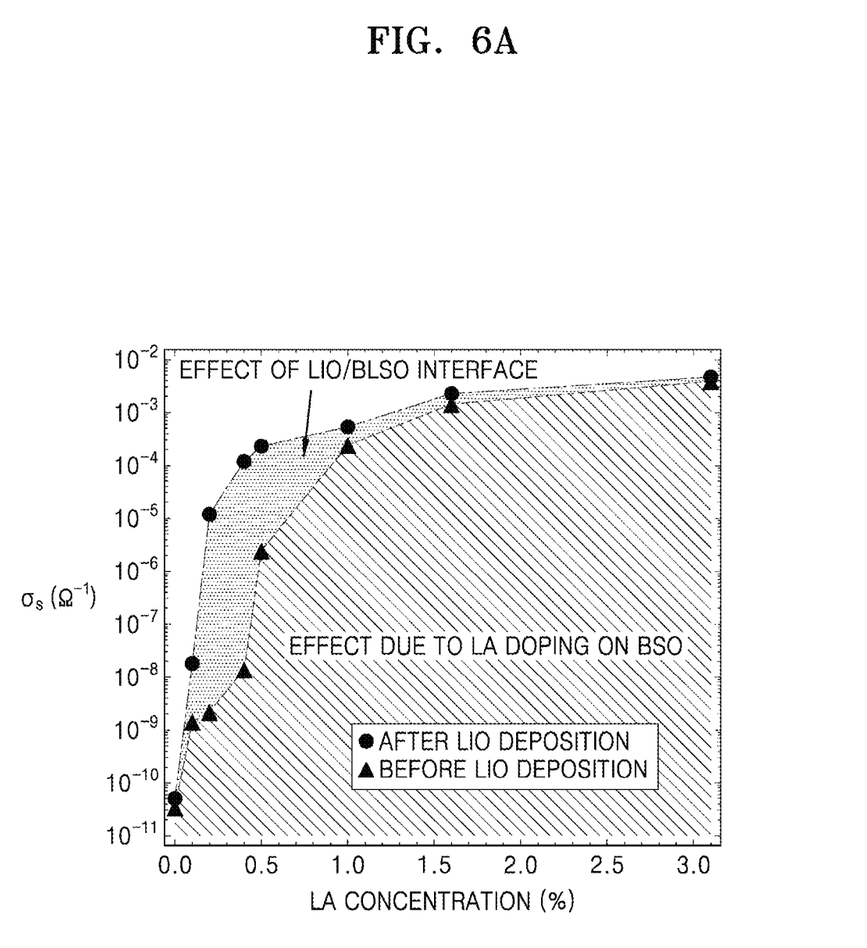
FIG. 6a is a graph showing a result of measuring electric conductivity properties of the basic structure (using an STO substrate) of the prior art of FIG. 1.

FIG. 6a is a graph showing a result of measuring electric conductivity properties of the basic structure (using an STO substrate) of the prior art of FIG. 1. Referring to FIG. 6a, a y axis denotes electric conductivity $\sigma_s(\Omega^{-1})$ of a sample and an x axis denotes concentration (%) of La doped on BSO. Also, a red broken line denotes a case where LIO is not deposited and a blue broken line denotes a case where LIO is deposited.

Following facts are identified through experiment results above.

First, when an LIO layer is not deposited (the red broken line), i.e., when there is no effect of a 2-dimensional electron gas by BSO and LIO, the electric conductivity is very low if doping of La on a BSO layer is 0%, i.e., if La is undoped on a BSO layer, but when La starts to be doped, drastic electric conductivity improvement occurs, and saturation is reached at about 3%.

Second, when an LIO layer is deposited on a BSO layer (the blue broken line), electric conductivity is also improved by La doping, but much more drastic electric conductivity improvement is achieved compared to when the LIO layer is not deposited (the red broken line), in particular, even when the La doping is low. Considering that a bandgap of LIO is about 5.0 eV, improvement of electric conductivity according to deposition of the LIO layer, i.e., a portion corresponding to a difference between two lines with respect to the same La doping concentration, is considered as electric conductivity improvement by a 2-dimensional electron gas formed at an interface between BSO and LIO.

Figure 6B:
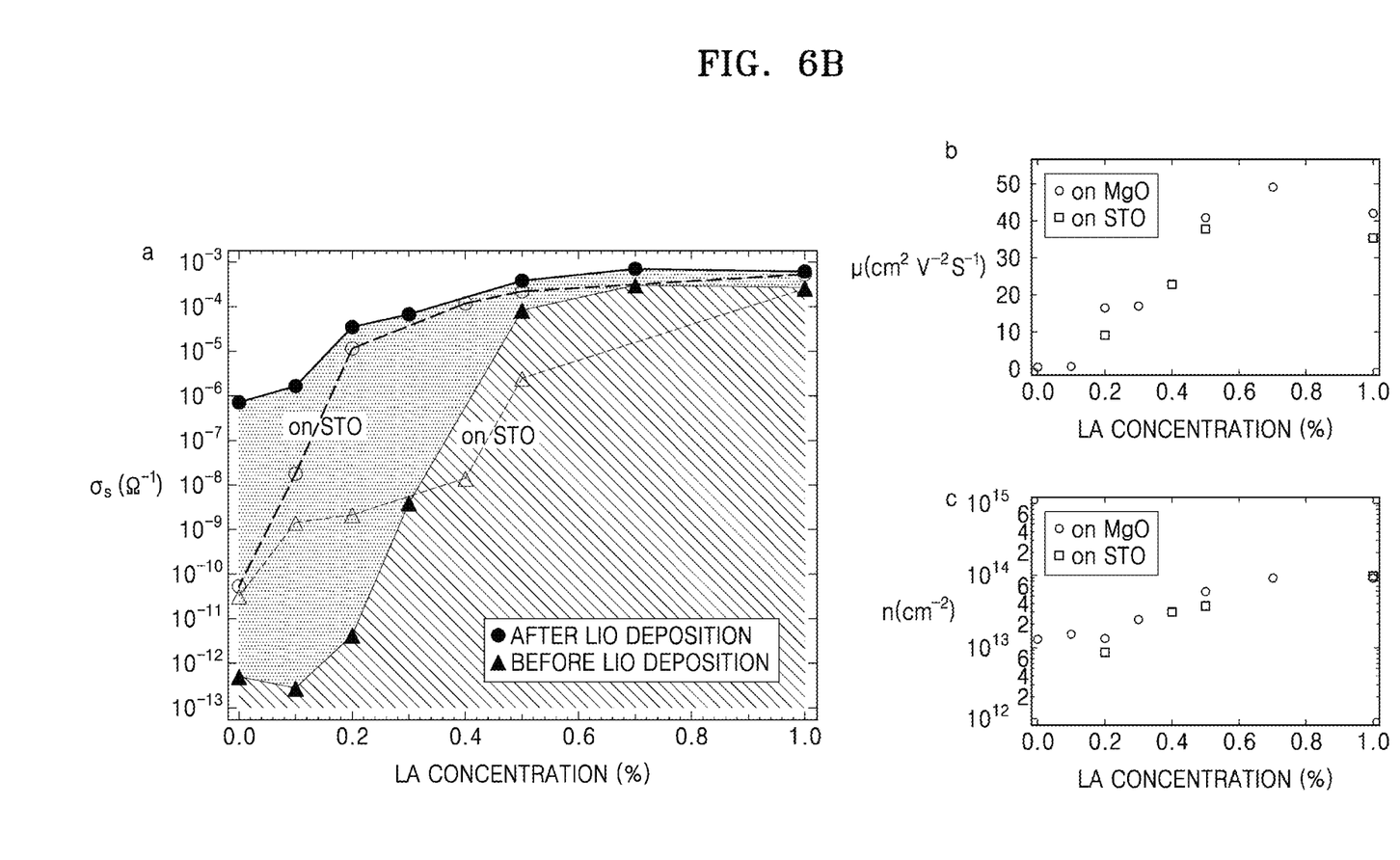
FIG. 6b illustrates measurement results of (a) electric conductivity, (b) electron mobility, and (c) carrier density of the basic structure according to an embodiment of the present disclosure of FIG. 2.

FIG. 6b is the same as FIG. 6a, but illustrates measurement results of (a) electric conductivity, (b) electron mobility, and (c) carrier density of the basic structure according to an embodiment of the present disclosure of FIG. 2. As in FIG. 2, an MgO substrate is used in FIG. 6b, but as described above, a substrate of a material other than STO may be used in addition to MgO. Also, as in FIG. 6a, a y axis denotes electric conductivity and an x axis denotes La doping concentration in (a) of FIG. 6b, wherein a red broken line denotes a case where an LIO layer is not deposited and a blue broken line denotes a case where an LIO layer is deposited. For comparison, the case of FIG. 6a, i.e., a result of using STO as a substrate according to the prior art, is shown in a light color in an electric conductivity graph.

A difference between 6a and (a) of FIG. 6b is that, when STO is used as a substrate (FIG. 6a), an effect of LIO layer deposition if La is not doped on a BSO layer, i.e., electric conductivity improvement by a 2-dimensional electron gas of a BSO/LIO interface, is not observed, whereas when MgO is used as a substrate ((a) of FIG. 6b), an effect of LIO layer deposition even if La is not doped on a BSO layer, i.e., electric conductivity improvement by a 2-dimensional electron gas of a BSO/LIO interface, is great. For example, in a structure using MgO as a substrate, a BSO/LIO interface in which La is not doped on a BSO layer has about $10^4$ times greater electric conductivity than a structure in which La is not doped on a BSO layer regarding a conventional structure using STO as a substrate, and about $10^2$ times greater electric conductivity than a structure in which La is doped 0.1% on a BSO layer.

Meanwhile, (b) and (c) of FIG. 6b illustrate electron mobility and carrier density regarding La doping on a BSO layer respectively in a conventional structure using STO as a substrate and a structure according to an embodiment of the present disclosure using MgO. It is identified that the structure according to an embodiment of the present disclosure using MgO as a substrate shows better electron mobility and carrier density.

Figure 7:
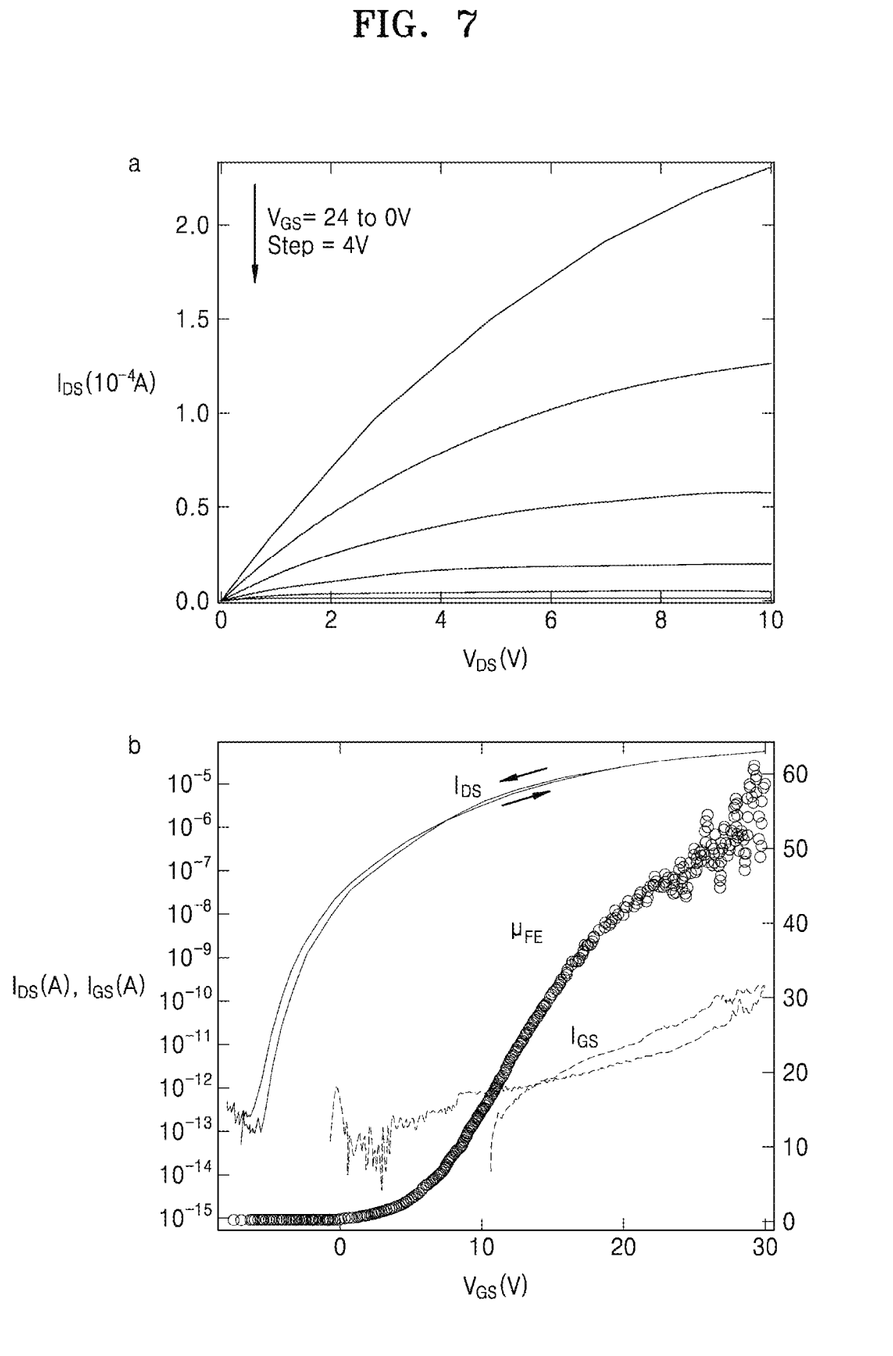

(a) and (b) of FIG. 7 illustrate results of experimenting with current-electron properties of an electronic device using 2-dimensional electron gas properties of an interface between BaSnO₃ and LaInO₃, according to an embodiment of the present disclosure. As shown in FIG. 3, a FET is used as an example.

(a) of FIG. 7 shows output characteristics of an FET according to an embodiment of the present disclosure, wherein a drain-source voltage VDs and a drain-source current IDS are measured while dropping a gate voltage from 24 V to 0 V by 4 V. It is identified that the drain-source voltage VDs where pinch-off occurs is high.

(b) of FIG. 7 shows switching characteristics of an FET according to an embodiment of the present disclosure, wherein the drain-source current IDS, a gate-source current $I_{GS}$, and field effect mobility $\mu_{FE}$ are measured when the drain-source voltage VDS is fixed to 1 V and a gate-source voltage $V_{GS}$ is swept. It is identified that clean switching is realized almost without a leakage current through a gate oxide. According to current measurement results, a switching on/off ratio ($I_{on}/I_{off}$) reaches about $10^9$.

Figure 8:
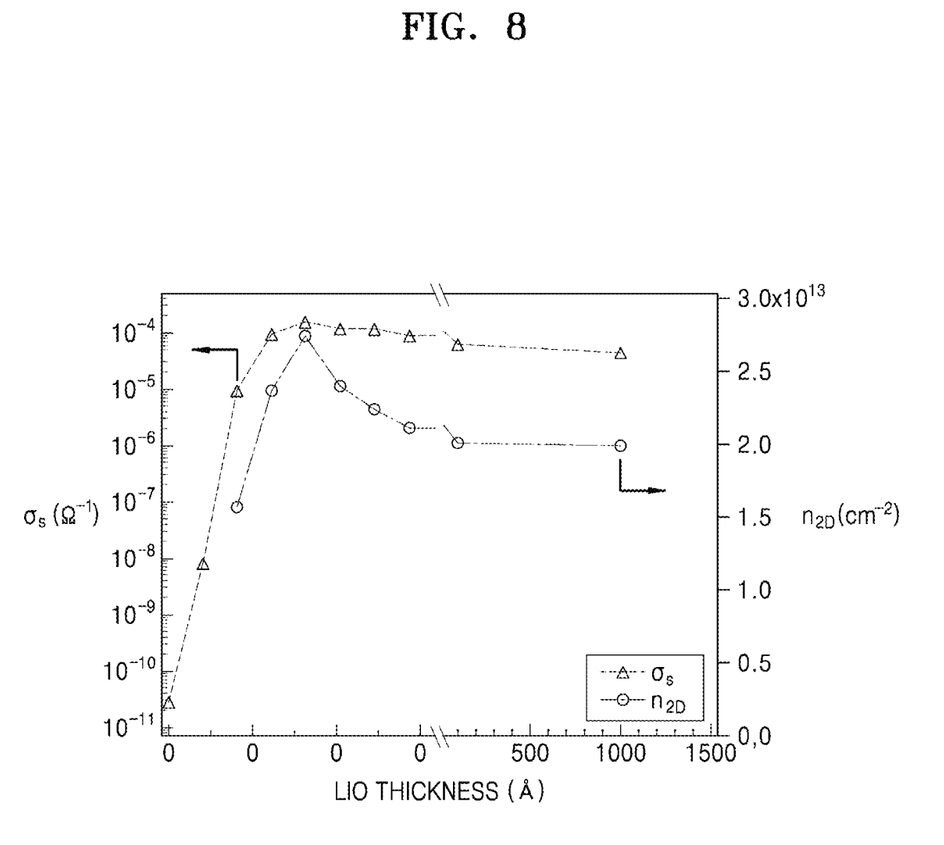
FIG. 8 illustrates a result of experimenting with electric conductivity and charge carrier density according to a deposition thickness of LIO in a basic structure using 2-dimensional electron gas properties of an interface between $BaSnO_3$ and $LaInO_3$, according to an embodiment of the present disclosure.

FIG. 8 illustrates a result of experimenting with electric conductivity and charge carrier density according to a deposition thickness of LIO in a basic structure using 2-dimensional electron gas properties of an interface between BaSnO₃ and LaInO₃, according to an embodiment of the present disclosure.

Measurement is performed for each LIO thickness of 4 angstroms, because a unit lattice thickness of LIO is 4 angstroms. In other words, dots in a graph of FIG. 9 correspond to increasing layers of unit lattice of deposited LIO.

Figure 9:
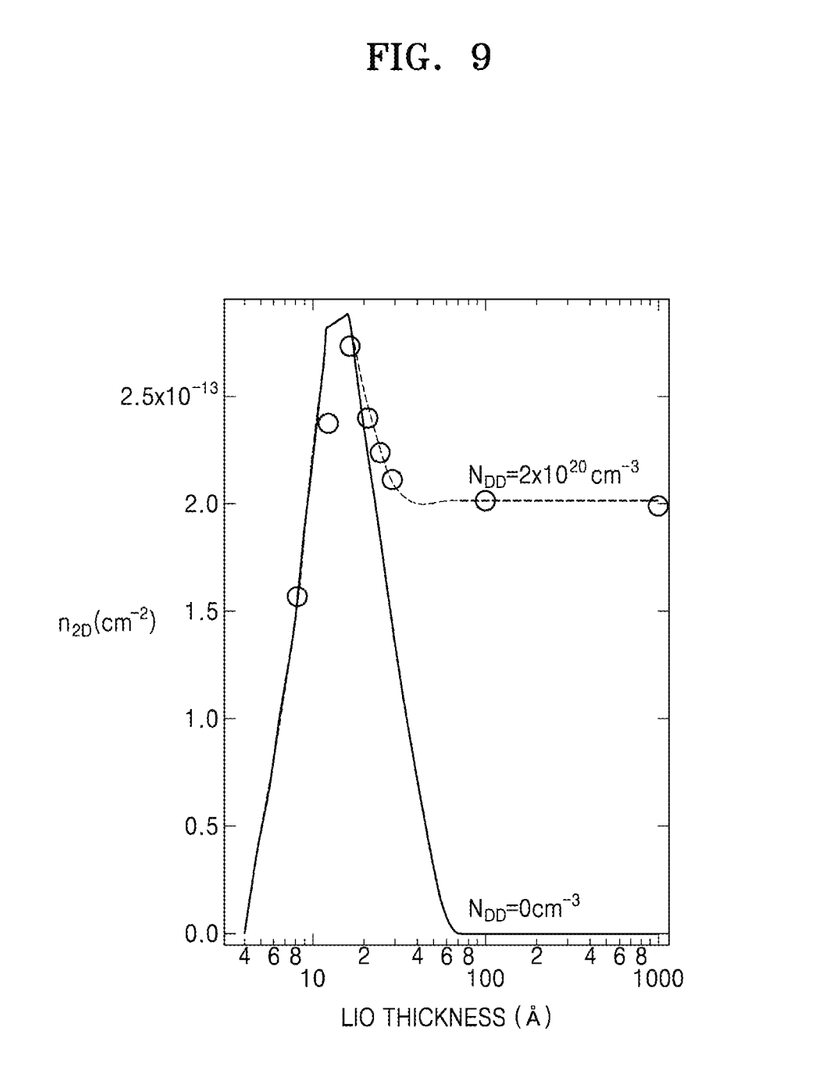
FIG. 9 illustrates electric conductivity and a simulation result according to a deposition thickness of LIO in a basic structure using 2-dimensional electron gas properties of an interface between BaSnO$_3$ and LaInO$_3$, according to an embodiment of the present disclosure.

According to measurement results, electric conductivity as and carrier density $n_{2D}$ increase until a thickness of LIO reaches a thickness of four unit cells, i.e., 16 angstroms, and then gradually decrease.

The inventors modeled the basic structure according to an embodiment of the present disclosure on a premise of a situation in which Poisson equation (Equation 1) and Schrodinger equation (Equation 2) to which effective mass approximation is applied are applied regarding a semiconductor well-known to one of ordinary skill in the art, and a deep donor $N_{DD}$ is present in LIO with concentration of $N_{DD}=2\times10^{20}$ cm⁻³, and a simulation result thereof has matched with an experiment result as shown in FIG. 9.

$$-\frac{d}{dx}\left(\varepsilon_s(x)\frac{d}{dx}\right)\phi = q(p - n + N_D^+ - N_A^-) \qquad \text{[Equation 1]}$$

Here, $\varepsilon_s(x)$ denotes a dielectric constant, p denotes electrostatic potential, q denotes an electron charge amount, p denotes hole carrier density, n denotes electron carrier density, $N_{D+}$ denotes the number of (positively) ionized donors, and $N_{A-}$ denotes the number of (negatively) ionized donors.

$$-\frac{\hbar^2}{2}\frac{d}{dx}\left(\frac{1}{m^*(x)}\frac{d}{dx}\right)\psi_l(x) + V(x)\psi_l(x) = E_l\psi_l(x), \qquad \text{[Equation 2]}$$

$$V(x) = -q\phi(x) + \Delta E_C(x)$$

Here, m* denotes effective mass, V(x) denotes potential energy, $\psi_l$ denotes a wave function, $E_l$ denotes energy, q denotes an electron charge amount, $\varphi(x)$ denotes electrostatic potential, and $\Delta E_c(x)$ denotes pseudopotential according to a band offset.

The simulation result is obtained by using the above two equations, by first obtaining n, p, $N_{D+}$, and $N_{A-}$ with a wave function obtained by inputting trial potential into Equation 2, obtaining new potential by inputting values thereof into Equation 1, obtaining a new wave function by inputting the new potential into Equation 2 again, and repeating such processes to obtain a wave function and potential simultaneously satisfying Equations 1 and 2.

Accordingly, one of ordinary skill in the art may model the basic structure and electronic device according to an embodiment of the present disclosure while including the above well-known equations and the concentration of the deep donor, and find a thickness of LIO optimizing performance of a device through a simulation.

Here, only an electronic device using an interface between BaSnO₃ and LaInO₃, according to embodiments of the present disclosure, has been described, but one of ordinary skill in the art may realize various application methods by using the present disclosure, all of which are included in the scope of the present disclosure.

While the present disclosure has been described above with reference to preferred embodiments, one of ordinary skill in the art will understand that the present disclosure may be variously modified and changed within a range that does not deviate from the spirit and areas of the present disclosure described in the following claims.

The invention claimed is:

1. An electronic device including an interface between BaSnO3 and LaInO3, the electronic device comprising:
    a substrate formed of a metal oxide of non-SrTiO3 material;
    a first buffer layer disposed on the substrate and formed of a BaSnO3 material;
    a BLSO layer disposed on at least a portion of the first buffer layer and formed of a (Ba1-x,Lax) SnO3 material, wherein x has a value equal to or greater than 0 and less than or equal to 1;
    an LIO layer at least partially disposed on at least a portion of the BLSO layer so as to form an interface between the LIO layer and the BLSO layer, and formed of an LaInO3 material; and
    a first electrode layer at least partially in contact with the interface between the BLSO layer and the LIO layer, and formed of at least two or more separated portions;
    wherein the LIO layer has a thickness between 15 to 17 angstroms.

2. The electronic device of claim 1, wherein the substrate is formed of an MgO material.

3. The electronic device of claim 1, further comprising a second electrode layer disposed on the LIO layer and not in contact with the first electrode layer, wherein the substrate is formed of an MgO material.

4. The electronic device of claim 2 or 3, further comprising a second buffer layer arranged between the substrate and the first buffer layer, and formed of a BaHfO₃ material.

5. The electronic device of claim 2, wherein the first electrode layer is formed of a $(Ba_{1-x}La_x)SnO_3$ material, wherein x is equal to or greater than 0.04.

6. The electronic device of claim 3, wherein at least one of the first electrode layer and the second electrode layer is formed of a $(Ba_{1-x}La_x)SnO_3$ material, wherein x is equal to or greater than 0.04.

* * * * *